United States Patent
Lan

(10) Patent No.: US 10,048,017 B2
(45) Date of Patent: Aug. 14, 2018

(54) HEAT DISSIPATION UNIT

(71) Applicant: ASIA VITAL COMPONENTS CO., LTD., New Taipei (TW)

(72) Inventor: Wen-Ji Lan, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 257 days.

(21) Appl. No.: 14/956,346

(22) Filed: Dec. 1, 2015

(65) Prior Publication Data

US 2017/0153064 A1    Jun. 1, 2017

(51) Int. Cl.
| | |
|---|---|
| F28F 7/00 | (2006.01) |
| F28D 15/00 | (2006.01) |
| F28F 1/00 | (2006.01) |
| F28D 15/04 | (2006.01) |
| F28D 15/02 | (2006.01) |
| H01L 23/427 | (2006.01) |
| F28D 21/00 | (2006.01) |

(52) U.S. Cl.
CPC .......... *F28F 1/006* (2013.01); *F28D 15/0233* (2013.01); *F28D 15/0275* (2013.01); *F28D 15/046* (2013.01); *H01L 23/427* (2013.01); *F28D 2021/0028* (2013.01)

(58) Field of Classification Search
CPC ............ H05K 7/20336; H05K 7/20663; H01L 23/427; F28D 15/02; F28D 15/0233; F28D 15/0275; F28D 15/04; F28D 15/046

See application file for complete search history.

(56) References Cited

U.S. PATENT DOCUMENTS

| | | | |
|---|---|---|---|
| 2007/0272399 A1* | 11/2007 | Nitta | F28D 15/0233 165/185 |
| 2008/0078530 A1* | 4/2008 | Chang | F28D 15/043 165/104.26 |
| 2010/0108297 A1* | 5/2010 | Chen | F28D 15/0233 165/104.26 |
| 2010/0147502 A1* | 6/2010 | Xu | F28D 15/0233 165/181 |
| 2010/0166574 A1* | 7/2010 | Zha | H01L 23/4006 417/362 |
| 2013/0327502 A1* | 12/2013 | Chen | H01L 23/4275 165/104.21 |

* cited by examiner

*Primary Examiner* — Jason Thompson

(57) ABSTRACT

A heat dissipation unit is provided and includes a casing and a heat pipe. The casing has a casing chamber which contains therein a working fluid. Casing capillaries are disposed on an inner wall of the casing chamber. The heat pipe has an open end and a closed end. A heat pipe chamber is defined between the open end and the closed end and communicates with the casing chamber through the open end. Heat pipe capillaries are disposed on an inner wall of the heat pipe chamber and are in capillary connection with the casing capillaries through the open end of the heat pipe.

4 Claims, 6 Drawing Sheets

HEAT DISSIPATION UNIT

BACKGROUND OF THE INVENTION

1. Technical Field

The present invention relates to heat dissipation units and more particularly to a heat dissipation unit for use in heat dissipation.

2. Description of Related Art

The trend toward thin and lightweight electronic apparatuses leads to downsized components of the existing electronic apparatuses at the cost of generating heat. The heat thus generated becomes the major obstacle in improving the performance of electronic apparatuses and systems. In a preliminary attempt to enhance heat dissipation of components inside electronic apparatuses, the industrial sector put forth heat pipes and vapor chambers which are efficient in heat transfer.

A vapor chamber is a rectangular case (or panel). Capillaries are disposed on the inner wall of a casing of the vapor chamber. The space defined by the inner wall of the casing and disposed within the casing is filled with a working fluid. A heat-generating component, such as a CPU, a southbridge and northbridge, a transistor, or a MCU, is attached to one side (i.e., evaporation region) of the casing and adapted to absorb the heat generated from the heat-generating component such that the working fluid, which is in a liquid state, evaporates at the evaporation region of the casing and thus turns gaseous to thereby transfer heat to a condensation region of the casing. The gaseous working fluid is cooled down at the condensation region to condense and turn liquid. Then, the liquid working fluid returns to the evaporation region by gravity or capillarity to continue with the gas-liquid cycle, thereby dissipating heat at uniform temperature efficiently.

Heat pipes share the same principle and theory with vapor chambers. Essential structural features of a heat pipe are as follows: a hollow-cored portion of the heat pipe with an annular cross section and a caliber defined by the annular cross section is filled with metal powder (or occupied by braided reticulated capillaries); ringlike capillaries are formed on the inner wall of the heat pipe by sintering; afterward, the heat pipe has a vacuum created inside and is filled with a working fluid; finally, the heat pipe gets closed to thereby form the required heat pipe structure. The working fluid is heated up at an evaporation portion of the heat pipe so as to evaporate and spread to a condensation end of the heat pipe. The working fluid is gaseous at the evaporation portion; in its course of leaving the evaporation portion and then spreading to the condensation end, the gaseous working fluid is gradually cooled down and eventually turned liquid by condensation, before flowing back to the evaporation portion through the capillaries.

The only difference between a vapor chamber and a heat pipe lies in the way of conducting heat. The former carries out heat conduction in a two-dimensional planar manner, whereas the latter carries out heat conduction in a one-dimensional linear manner.

Accordingly, it is imperative to use the aforesaid two heat transfer units more efficiently.

SUMMARY OF THE INVENTION

In view of the aforesaid drawbacks of the prior art, it is an objective of the present invention to provide a heat dissipation unit which comprises a casing and a heat pipe with their respective cavities in communication with each other, characterized in that capillaries in the casing chamber of the casing are in capillary connection with capillaries in the heat pipe chamber of the heat pipe.

Another objective of the present invention is to provide a heat dissipation unit comprising a casing and a heat pipe, wherein the thickness of casing capillaries in the casing chamber of the casing equals the sum of the thickness of the wall of the heat pipe and the thickness of heat pipe capillaries such that the casing capillaries are in capillary connection with the heat pipe capillaries.

Yet another objective of the present invention is to provide a capillary force that is transmitted or extended from the casing chamber of the casing to the heat pipe chamber of the heat pipe such that a working fluid which has been cooled down flows from the heat pipe to a heat transfer unit in the casing under the capillary force.

In order to achieve the above and other objectives, the present invention provides a heat dissipation unit, comprising: a casing having a casing chamber containing therein casing capillaries and a working fluid; and a heat pipe having a closed end, an open end and a heat pipe wall, with the heat pipe wall having an outer side and an inner side, wherein the inner side defines a heat pipe chamber in communication with the open end such that heat pipe capillaries are disposed on the inner side of the heat pipe wall and disposed in the heat pipe chamber, wherein the open end of the heat pipe is inserted into the casing chamber to allow the heat pipe chamber to be in communication with the casing chamber through the open end, and the heat pipe capillaries are in capillary connection with the casing capillaries.

In an embodiment of the present invention, the casing capillaries are defined with a first thickness in part or in whole, the heat pipe wall with a second thickness, and the heat pipe capillaries with a third thickness, wherein the first thickness equals the sum of the second thickness and the third thickness.

In an embodiment of the present invention, the casing capillaries have a first end, and the heat pipe capillaries have a second end in capillary connection with the first end.

In an embodiment of the present invention, the casing chamber has a casing inner wall defined with a capillary-free region, wherein the casing capillaries are disposed on the casing inner wall and are not positioned proximate to the capillary-free region.

In an embodiment of the present invention, the casing capillaries have a first connection side which connects with the casing inner wall and a first free side which faces the casing chamber, with the first thickness defined between the first connection side and the first free side; the heat pipe capillaries have a second connection side which connects with the inner side of the heat pipe wall and a second free side which faces the heat pipe chamber, with the third thickness defined between the second connection side and the second free side.

BRIEF DESCRIPTION OF THE DRAWINGS

The diagrams below aim to render the present invention more comprehensible and are described in detail below so that they are integrated with the preferred embodiments of the present invention. The principles of the present invention are explained with the diagrams and preferred embodiments of the present invention.

DETAILED DESCRIPTION OF THE EMBODIMENT OF THE INVENTION

The aforesaid objectives, structural features and functional features of the present invention are hereunder described with reference to preferred embodiments illustrated with the accompanying drawings.

Figure 1:
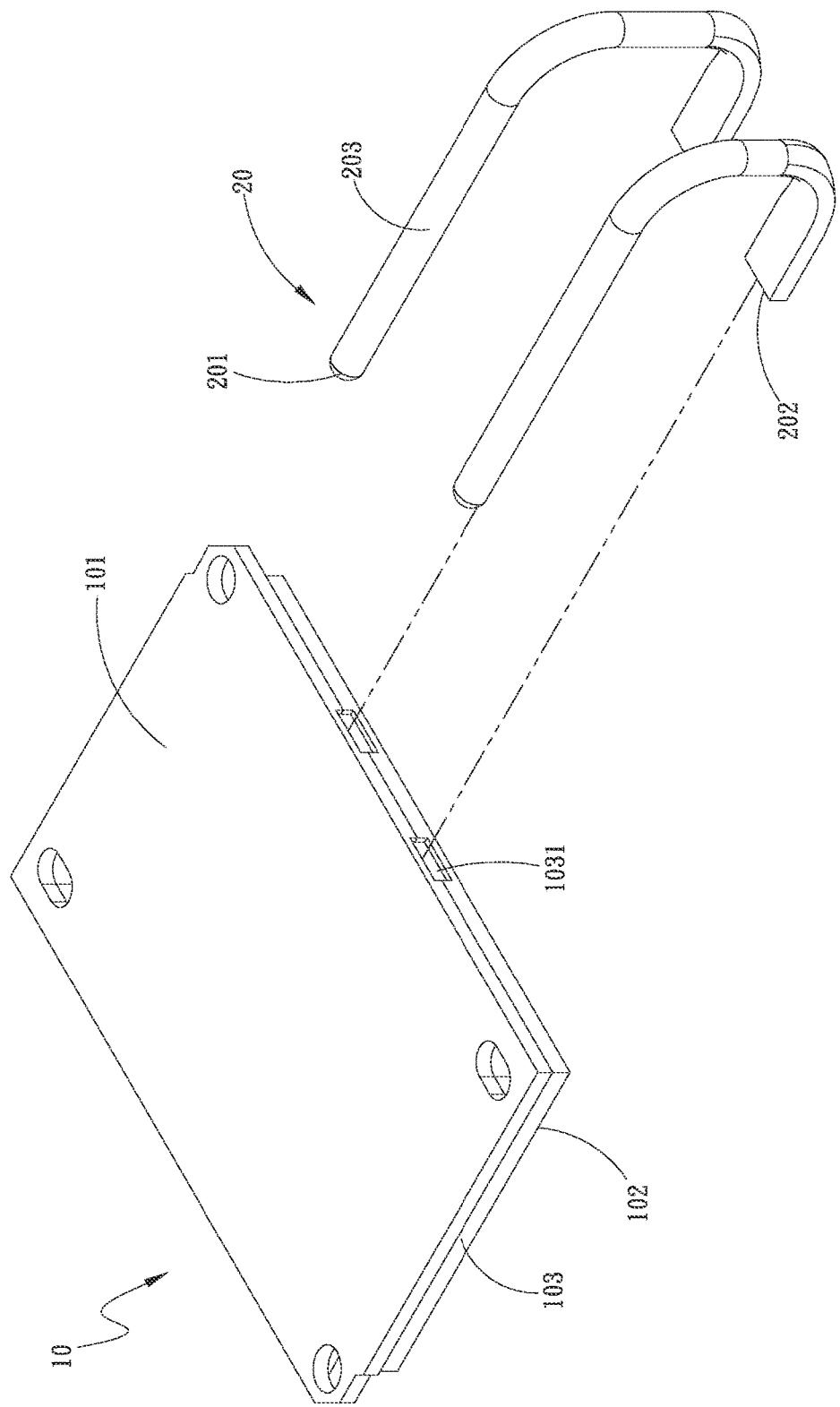
FIG. 1 is an exploded view of a heat dissipation unit of the present invention.
Figure 2:
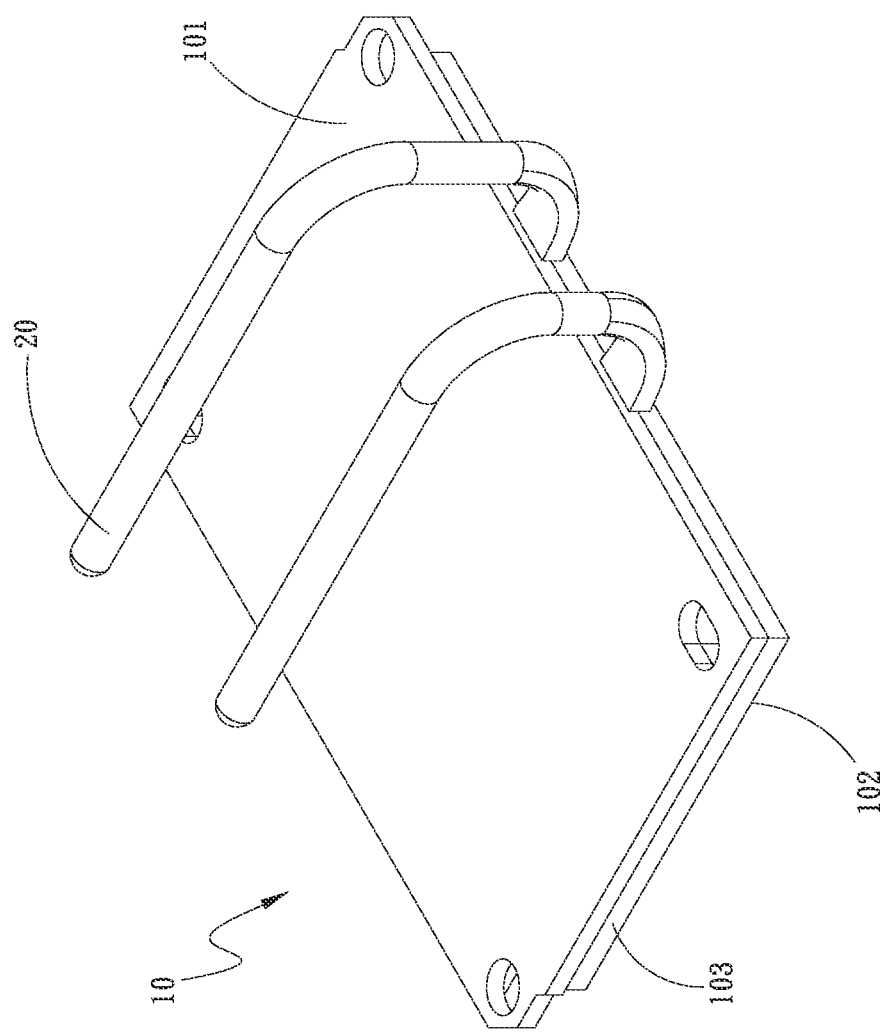
FIG. 2 is a perspective view of the heat dissipation unit of the present invention.
Figure 3:
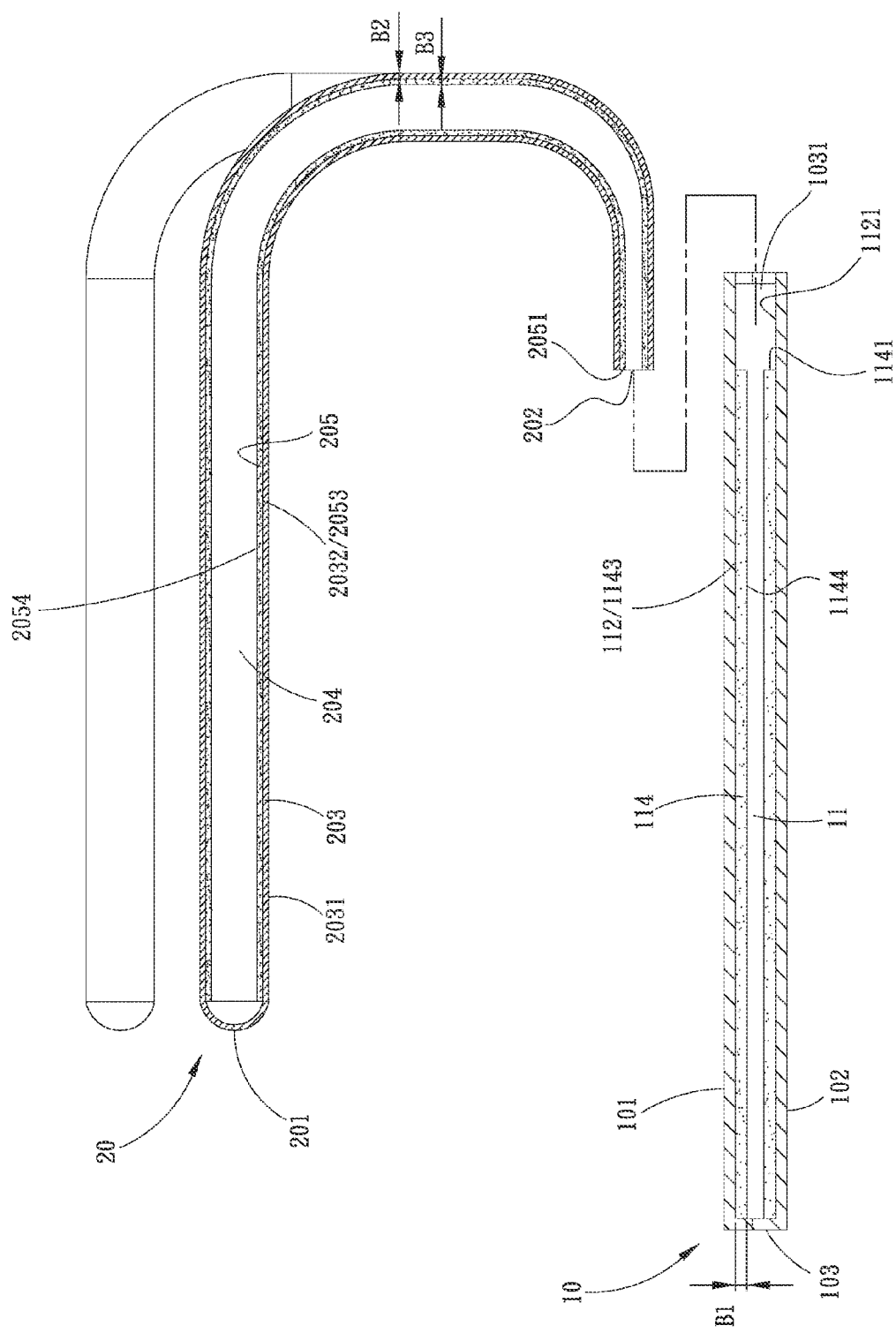
FIG. 3 is an exploded cross-sectional view of the heat dissipation unit of the present invention.
Figure 4:
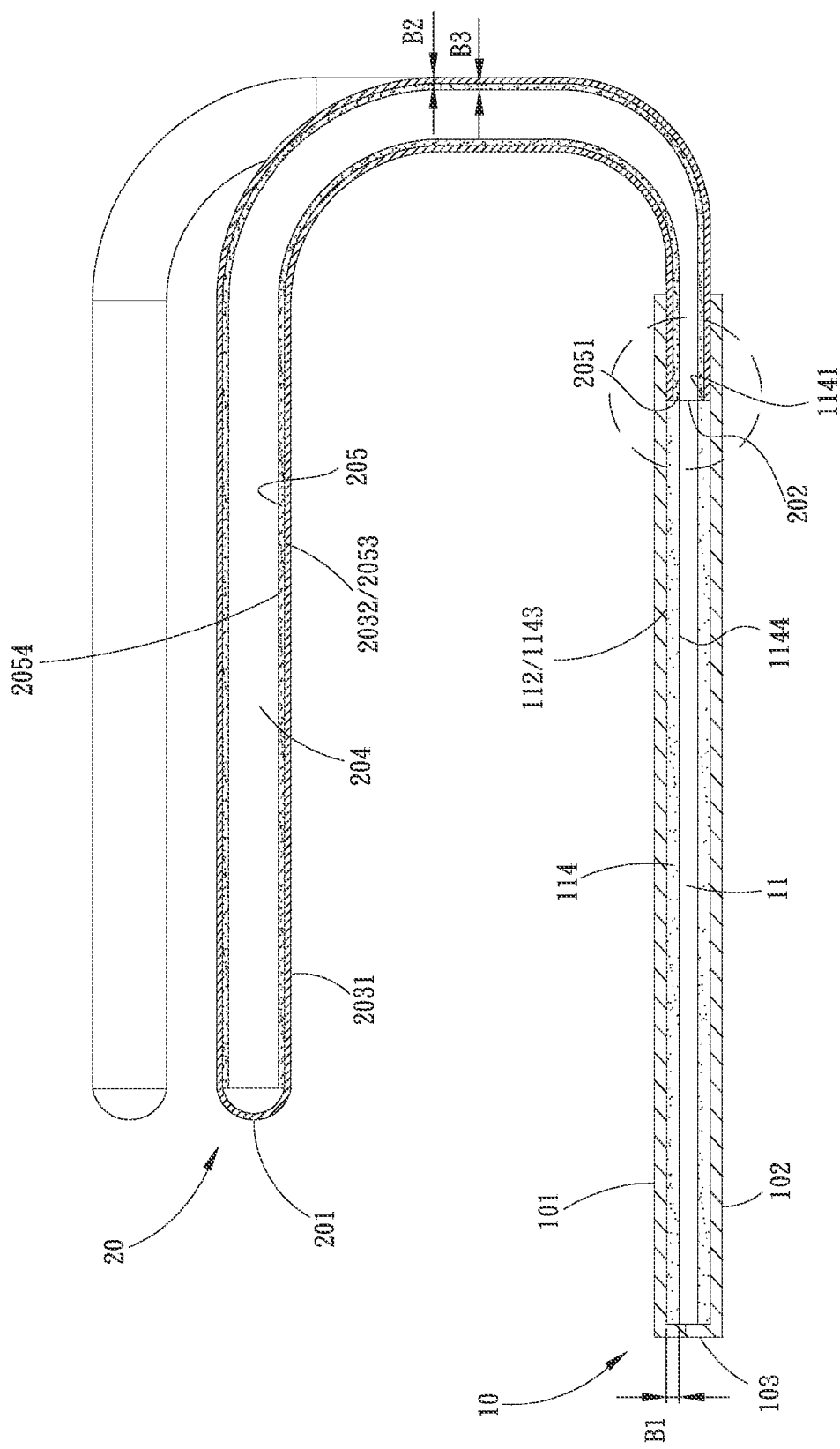
FIG. 4 is an assembled cross-sectional view of the heat dissipation unit of the present invention.
Figure 5:
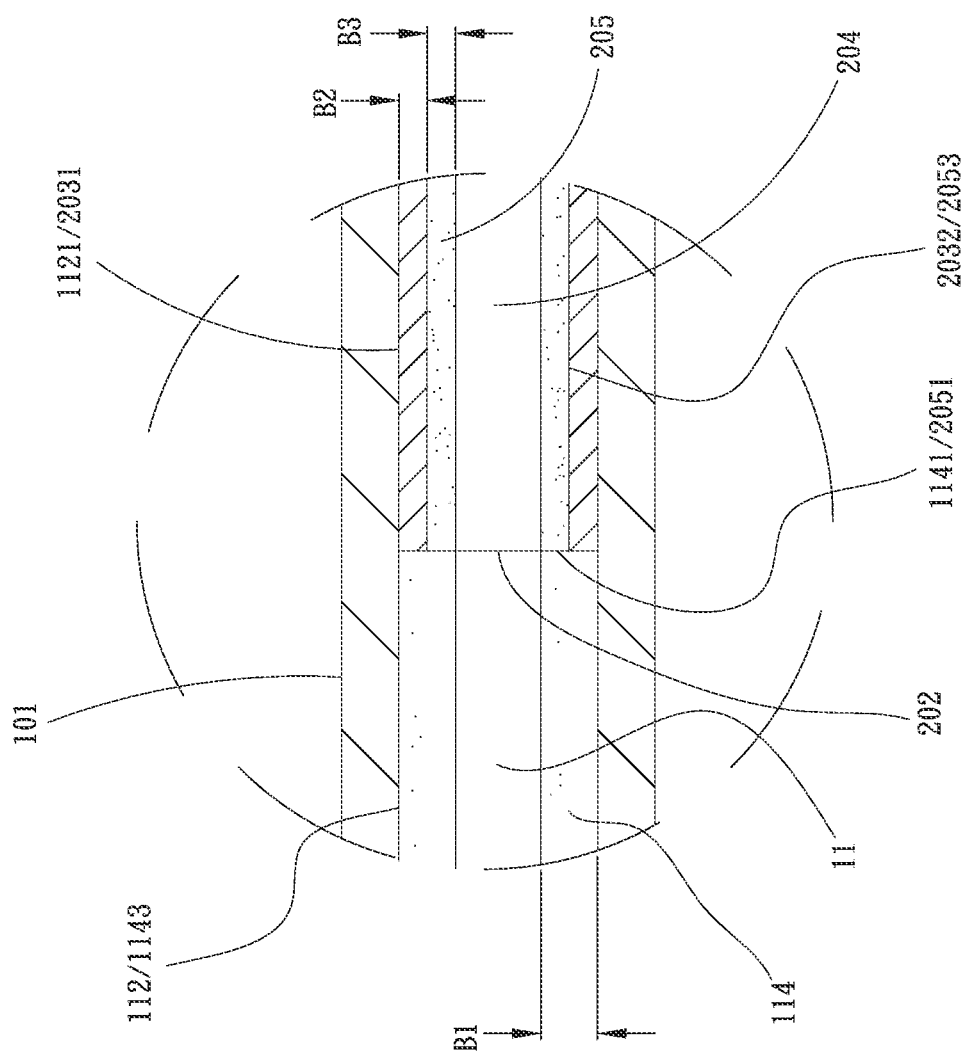
FIG. 5 is a partial enlarged view of FIG. 4.

FIG. 1 is an exploded view of a heat dissipation unit of the present invention. FIG. 2 is a perspective view of the heat dissipation unit of the present invention. FIG. 3 is an exploded cross-sectional view of the heat dissipation unit of the present invention. FIG. 4 is an assembled cross-sectional view of the heat dissipation unit of the present invention. FIG. 5 is a partial enlarged view of FIG. 4. As shown in the diagrams, the heat dissipation unit of the present invention comprises a casing 10 and at least a heat pipe 20. The casing 10, which is a flat-plate heat transfer unit, such as a vapor chamber or a flat-plate heat pipe, has a top side 101, a bottom side 102 and a lateral side 103 annularly disposed between the top side 101 and the bottom side 102. At least an opening 1031 is disposed at the lateral side 103 and corresponds in quantity to the at least a heat pipe 20.

A casing chamber 11 is defined among the top side 101, the bottom side 102 and the lateral side 103. The casing chamber 11 receives therein a working fluid (not shown) and casing capillaries 114. The working fluid includes but is not limited to pure water, an inorganic compound, an alcohol, a ketone, a liquid metal, a coolant, an organic compound or a mixture thereof. The casing chamber 11 has a casing inner wall 112. The casing inner wall 112 is defined with a capillary-free region 1121 adjacent to the opening 1031. The casing capillaries 114 are disposed on the casing inner wall 112, are not positioned proximate to the capillary-free region 1121, and have a first end 1141 corresponding in position to the capillary-free region 1121.

The at least a heat pipe 20 has a closed end 201, an open end 202 and a heat pipe wall 203. The heat pipe wall 203 has an outer side 2031 and an inner side 2032. The inner side 2032 defines a heat pipe chamber 204 which is disposed between the closed end 201 and the open end 202 and in communication with the open end 202. Heat pipe capillaries 205 are disposed on the inner side 2032 of the heat pipe wall 203, extend from the heat pipe chamber 204 to the open end 202, and have a second end 2051 at the open end 202.

The closed end 201 of the at least a heat pipe 20 extends in a specific direction, including but not limited to extending horizontally or bending and then extending to above the casing 10. The open end 202 of the at least a heat pipe 20 penetrates the lateral side 103 of the casing 10 before being inserted into the casing chamber 11; hence, the heat pipe chamber 204 is in communication with the casing chamber 11 through the open end 202, and the heat pipe capillaries 205 are in capillary connection with the casing capillaries 114. Therefore, the first end 1141 of the casing capillaries 114 is in capillary connection with the second end 2051 of the heat pipe capillaries 205.

The casing capillaries 114 have a first connection side 1143 connecting with the casing inner wall 112 and a first free side 1144 facing the casing chamber 11. The heat pipe capillaries 205 have a second connection side 2053 connecting with the inner side 2032 of the heat pipe wall 203 and a second free side 2054 facing the heat pipe chamber 204. The casing capillaries 114 and the heat pipe capillaries 205 are, for example, provided in the form of sintered metal powder, mesh fabric bodies, grooves or multifiber, and are porous to thereby provide a capillary force for driving the working fluid to flow.

The capillary connection occurs whenever the casing capillaries 114 are in porous communication with the heat pipe capillaries 205 to not only allow the capillary force to be transmitted or extended from the heat pipe capillaries 205 to the casing capillaries 114 but also allow the cooled-down working fluid to flow under the capillary force from the heat pipe capillaries 205 back to the casing capillaries 114 and ultimately to the casing chamber 11.

The casing capillaries 114 are defined with a first thickness B1 between the first connection side 1143 and the first free side 1144. The heat pipe wall 203 is defined with a second thickness B2 between the outer side 2031 and the inner side 2032. The heat pipe capillaries 205 are defined with a third thickness B3 between the second connection side 2053 and the second free side 2054. The first thickness B1 of the casing capillaries 114 equals the sum of the second thickness B2 of the heat pipe wall 203 and the third thickness B3 of the heat pipe capillaries 205. Hence, the casing capillaries 114 are in direct capillary connection with the heat pipe capillaries 205 to thereby ensure the capillary connection which might otherwise be compromised by uneven thickness or height difference.

The diagrams illustrative of this embodiment show that the casing capillaries 114 are entirely of the first thickness B1. By contrast, in a variant embodiment, the first end 1141 of the casing capillaries 114 is of the first thickness B1, but the remainder of the casing capillaries 114 is of a thickness slightly less than the first thickness B1, to not only reduce the space attributed to the casing chamber 11 and taken up by the casing capillaries 114 but also allow the casing capillaries 114 to be in direct capillary connection with the heat pipe capillaries 205.

Figure 6:
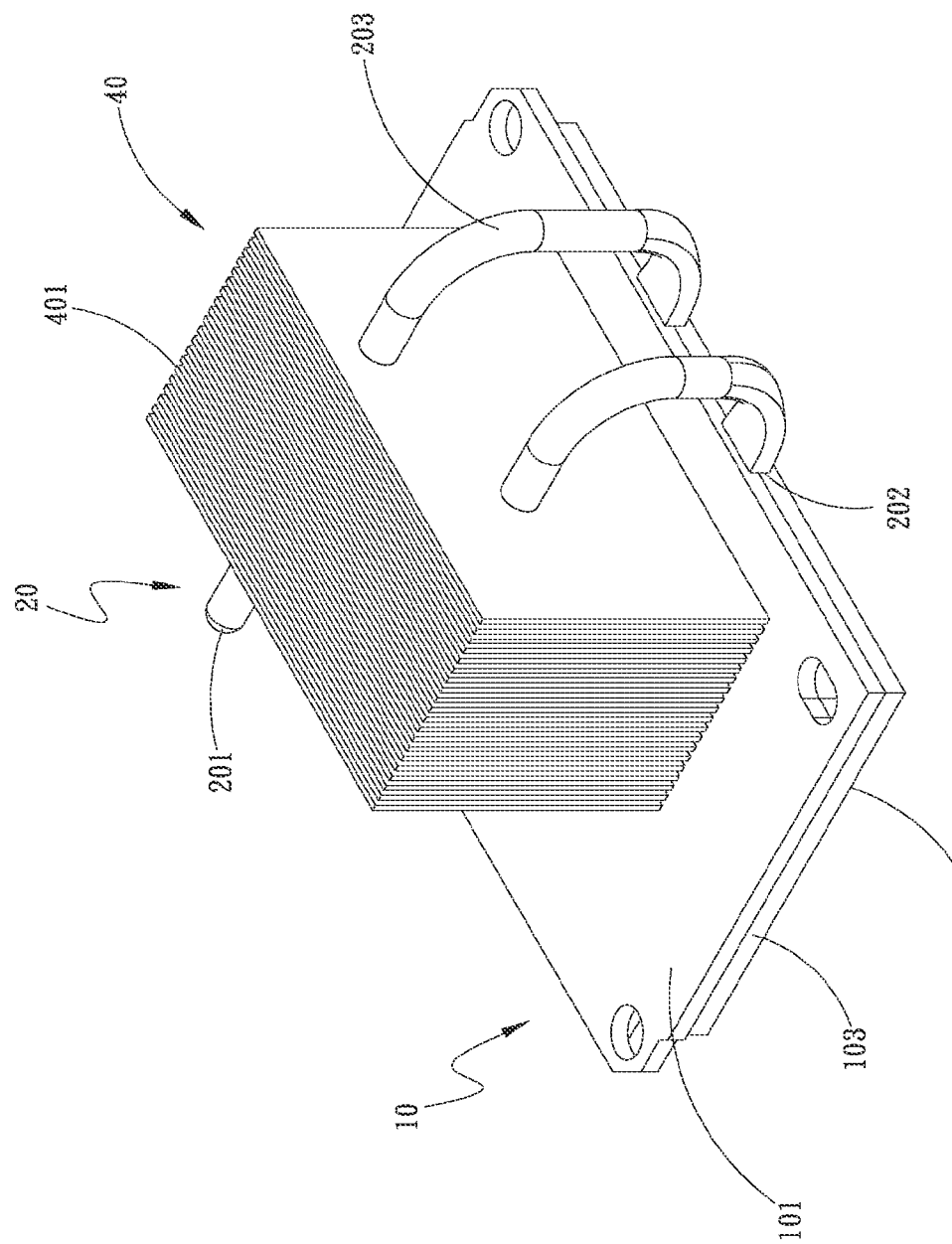
FIG. 6 is a schematic view of a fin set coupled to the heat dissipation unit of the present invention.

Referring to FIG. 6 as well as FIGS. 1-5, a heat-dissipating fin set 40 is penetrated by the at least a heat pipe 20 and disposed above the casing 10. The heat-dissipating fin set 40 comprises a plurality of heat-dissipating fins 401 spaced apart from each other and adapted to enhance heat dissipation of the working fluid in the at least a heat pipe 20.

Therefore, the working fluid in the casing chamber 11 absorbs heat and evaporates to thereby turn gaseous, and then the gaseous working fluid flows into the heat pipe chamber 204 via the open end 202 of the at least a heat pipe 20. The gaseous working fluid in the heat pipe chamber 204 dissipates heat through the heat-dissipating fin set 40 and thus cools down to thereby turn liquid. Under the capillary force, the liquid working fluid flows from the heat pipe capillaries 205 back to the casing capillaries 114 and ultimately to the casing chamber 11.

Therefore, the casing capillaries 114 are in capillary connection with the heat pipe capillaries 205, and in consequence the capillary force is transmitted or extended from the heat pipe chamber 204 to the casing chamber 11 and vice versa.

Although the aforesaid description relates to the preferred and feasible embodiments of the present invention only, all variations made to the present invention and attributed to the aforesaid methods, shapes, structures and devices of the present invention shall fall within the scope of the appended claims of the present invention.

What is claimed is:

1. A heat dissipation unit, comprising:

a casing having a casing chamber containing therein casing capillaries and a working fluid, the casing chamber having a casing inner wall defined with a capillary-free region toward an end of the casing and adjacent to an opening in the casing chamber, the casing capillaries being disposed on the casing inner wall and being positioned relative to the capillary-free region; and a heat pipe having a closed end, an open end and a heat pipe wall, with the heat pipe wall having an outer side and an inner side, wherein the inner side defines a heat pipe chamber in communication with the open end such that heat pipe capillaries are disposed on the inner side of the heat pipe wall and extend from the heat pipe chamber to the open end, wherein the open end of the heat pipe is inserted into the casing chamber through said opening to allow the heat pipe chamber to be in communication with the casing chamber through the open end, and the heat pipe capillaries are in capillary connection with the casing capillaries wherein the casing capillaries are defined with a first thickness, the heat pipe wall with a second thickness, and the heat pipe capillaries with a third thickness, wherein the first thickness equals a sum of the second thickness and the third thickness.

2. The heat dissipation unit of claim 1, wherein the casing capillaries have a first end, and the heat pipe capillaries have a second end in capillary connection with the first end.

3. The heat dissipation unit of any one of claim 1, wherein the casing has a top side, a bottom side and a lateral side surrounding a perimeter between the top side and the bottom side, and the casing chamber is defined among the top side, the bottom side and the lateral side.

4. The heat dissipation unit of claim 3, wherein the opening in the casing chamber is formed on the lateral side of the casing.

* * * * *